United States Patent
Chiou et al.

[19]

[11] Patent Number: 6,082,582
[45] Date of Patent: Jul. 4, 2000

[54] AUTOMATED CARRIER TUBE LOADING APPARATUS

[75] Inventors: Chie-Wun Chiou; Horng-Huei Tseng, both of Hsinchu, Taiwan

[73] Assignee: Vanguard International Semiconductor Corporation, Hsinchu, Taiwan

[21] Appl. No.: 09/057,298

[22] Filed: Apr. 8, 1998

[51] Int. Cl.⁷ ..................................................... B23Q 7/02

[52] U.S. Cl. ........................... 221/265; 221/168; 221/266

[58] Field of Search ..................................... 221/266, 168, 221/265

[56] References Cited

U.S. PATENT DOCUMENTS

| | | | |
|---|---|---|---|
| 5,722,564 | 3/1998 | Tiraboschi | 221/266 |
| 5,860,563 | 6/1997 | Guerra et al. | 221/266 |

*Primary Examiner*—Christopher P. Ellis
*Assistant Examiner*—Mark Deuble
*Attorney, Agent, or Firm*—Tung & Associates

[57] ABSTRACT

A method and an apparatus for the automated loading of integrated circuit carrier tubes into a tube dispensing device in a predetermined, preferred orientation without the attention of a human operator are described. The method utilizes a roller equipped with tube cavities in its peripheral surface and rotates the roller in a clockwise direction for receiving tube carriers from a top hopper-shaped opening and discharging the tube carriers from a bottom opening by gravity.

20 Claims, 1 Drawing Sheet

AUTOMATED CARRIER TUBE LOADING APPARATUS

FIELD OF THE INVENTION

The present invention generally relates to an apparatus for handling integrated circuit (IC) carrier tubes in a fabrication facility and more particularly, relates to an apparatus for the automated loading of IC carrier tubes into a tube dispensing device in a predetermined orientation such that packaged IC chips may be inserted into the carrier tubes in the tube dispensing device.

BACKGROUND OF THE INVENTION

In the manufacturing of semiconductor IC chips, the safe handling and transportation of chips without incurring damages is a very important aspect of the process. An IC chip, due to its fragile and delicate nature, is frequently protected during handling and processing from damages by encasing the chip in a plastic package. The IC chip may also be encased in a ceramic material at a higher cost.

In recently developed packaging technologies for integrated circuit chips, a small outline J-lead (SOJ) type package that can be either a 300 mil or a 400 mil SOJ has been popularly used. For a 300 mil SOJ, the package has a length of 680 mil, a width of 300 mil and a thickness of 118 mil. Other IC chip packages such as quad flat package (QFP), thin quad flat package (TQFP), thin small outline package (TSOP) have also been used in the industry. In these packages, the body portion of the integrated circuit chip is encased in a thermoplastic material injection molded in a plastic molding process to protect from damages during handling and processing. However, the connecting leads that are attached to the body portion and used to connect the IC chip to other circuitry are exposed around the periphery of the molded plastic package.

The plastic encased IC chips of either a SOJ, QFP, TQFP or TSOP type package must be handled and transported between work stations for further processing in a fabrication plant. Extreme care, therefore, must be taken to protect the connecting leads protruding from the packages from being bent, broken off or otherwise damaged during such handling and transportation. The plastic encased IC chips are normally transported in a tray or, better protected, in a carrier tube. A carrier tube is a plastic container that is extruded in an elongated shape having a substantially rectangular cross-section that can be conveniently used for storing and transporting various IC packages. The carrier tube can be extruded of a plastic material that has a non-transparent plastic body and a transparent window on top, or can be extruded completely in a transparent plastic material. The ends of the carrier tube are left open to allow tubes of any length to be manufactured, and to allow the insertion or removal of IC packages from either end of the carrier tube.

When an IC carrier tube is used to store packaged chips, the tubes are frequently loaded into a tube dispensing device for the insertion of the chips. The process requires a factory technician to manually picking up the carrier tube and then placing them into the dispensing device. It is a laborious task which requires the full attention of a technician.

It is therefore an object of the present invention to provide an apparatus and a method for loading IC carrier tubes into a tube dispensing device that can be performed in an automated manner without the attention of a human operator.

It is another object of the present invention to provide an apparatus for the automated loading of IC carrier tubes into a tube dispensing device by utilizing an annular roller that is provided with a plurality of tube cavities in its annular surface.

It is a further object of the present invention to provide an apparatus for the automated loading of IC carrier tubes into a tube dispensing device utilizing an annular roller which is freely rotatable in an annular cavity formed in a loader body that has a top opening for admitting the tubes and a bottom opening for discharging the tubes in a preferred orientation.

It is another further object of the present invention to provide an apparatus for the automated loading of IC carrier tubes into a tube dispensing device that is capable of dispensing IC carrier tubes in a predetermined orientation of either facing up or facing down.

SUMMARY OF THE INVENTION

The present invention provides an apparatus for the automated loading of IC carrier tubes into a tube dispensing device such that the tubes are arranged in a predetermined orientation without the need for a human operator.

In a preferred embodiment, an apparatus for the automatic loading of IC carrier tubes into a tube dispensing device in a predetermined orientation is provided which includes a loader body that has a front surface, a rear surface, a top surface, a bottom surface and an annular cavity formed by the front surface and the rear surface adapted for receiving an annular roller therein and maintaining a gap therebetween for allowing rotation of the annular roller in the annular cavity, a first opening in the top surface of the loader body for communication with the annular roller, the opening has a width substantially larger than a width of the carrier tube such that a plurality of the carrier tubes may be stowed in the opening, a second opening in the bottom surface of the loader body for communication with a tube dispensing device, the second opening has a width sufficient to allow only one carrier tube to pass therethrough, and an annular roller situated in the annular cavity that has a plurality of tube cavities in the annular surface each adapted for receiving a carrier tube such that when the roller rotates in the annular cavity, each of the tube cavities receives a carrier tube from the first opening and dispenses the carrier tube from the second opening into a tube dispensing device in a predetermined orientation.

The loader body may have a depth that is substantially similar to a length of the annular roller. The annular roller is received in and spaced apart from the annular cavity such that the annular roller rotates freely in the annular cavity when each of the plurality of tube cavities carries a carrier tube. Each of the plurality of tube cavities in the surface of the annular roller is equipped with two sidewalls and a bottom wall, one of the sidewalls opposite to the direction of rotation is sloped toward an opposite direction of the rotation to facilitate the sliding of one of the carrier tubes into the tube cavity. The sloped sidewalls in the plurality of tube cavities are equipped with spring means to facilitate the ejection of a carrier tube when the tube cavity is rotated to a position juxtaposed to the bottom opening in the loader body. The spring means can be suitably of steel balls mounted in recesses provided in the sloped sidewalls with spring pushing the steel balls outwardly such that the balls are partially protruded outside the surface in the sloped sidewalls for exerting an outward pressure on the carrier tubes. The first opening is sufficiently large for accepting a multiplicity of carrier tubes, for instance, at least 10 tubes. The plurality of tube cavities in the annular roller includes at least 8 cavities. The tube dispensing device is formed by two parallel plates positioned side-by-side which has a cavity therebetween sufficient for the carrier tubes to fit snugly in the cavity by stacking one on top of the other. The annular roller is mounted on a shaft through an aperture extending in a longitudinal direction at the center of the roller. The annular roller rotates in a clockwise direction. The carrier tubes may have a U-shaped cross-section and fall into the tube cavities on the annular roller with the opening of the U-shape pointing toward a center of the annular roller. The carrier tubes may also have a rectangular cross-section.

The present invention is further directed to a method for conveying carrier tubes into a tube dispensing device in a preset orientation which can be carried out by the operating steps of first providing a tube loading machine that has a tube loader body and an annular cavity in the body, the tube loader body has a hopper-shaped top opening of a size sufficient for receiving a multiplicity of carrier tubes and a slot-shaped bottom opening having a width sufficient to allow package tubes to pass therethrough one at a time, mounting an annular roller in the annular cavity and allowing the roller to rotate freely in the cavity, the annular roller has a plurality of tube cavities provided on its surface each adapted for receiving a carrier tube therein, loading a carrier tube in each of the tube cavities on the annular roller by rotating the roller body, and depositing a carrier tube into the tube dispensing device through the slot-shaped bottom opening in the tube loader body when the tube cavity is turned to a position exposing the opening.

The method may further include the step of rotating the annular roller at a rotational speed of at least 5 RPM. The method may further include the step of providing spring means in a surface of the tube cavity to facilitate the ejection of the carrier tube into the tube dispensing device. The annular roller is mounted in its annular cavity by a shaft extending through an aperture in the annular roller.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses an apparatus and a method for the automated loading of integrated circuit carrier tubes into a tube dispensing device that is capable of loading the tubes in a preferred orientation in an automated manner without the attention of an operator. The present invention enables the carrier tubes to be loaded into tube dispensing devices either for loading of packaged IC chips or for other processing steps at significant labor cost savings.

By utilizing the present invention apparatus, a multiplicity of IC carrier tubes can be loaded into a hopper on the automated loading apparatus. A roller that rotates in an annular cavity in the apparatus then carries the IC carrier tubes situated in tube cavities provided in its peripheral surface by first loading them from the hopper. As the roller rotates in a clockwise direction such that a tube cavity is exposed to a bottom opening of the apparatus, a carrier tube falls by gravity into a tube dispensing device in a preferred, predetermined orientation. For instance, when carrier tubes of U-shape are used, the orientation of the opening of the U may be suitably controlled such that they all face upward when loaded into the dispensing apparatus.

Figure 1:
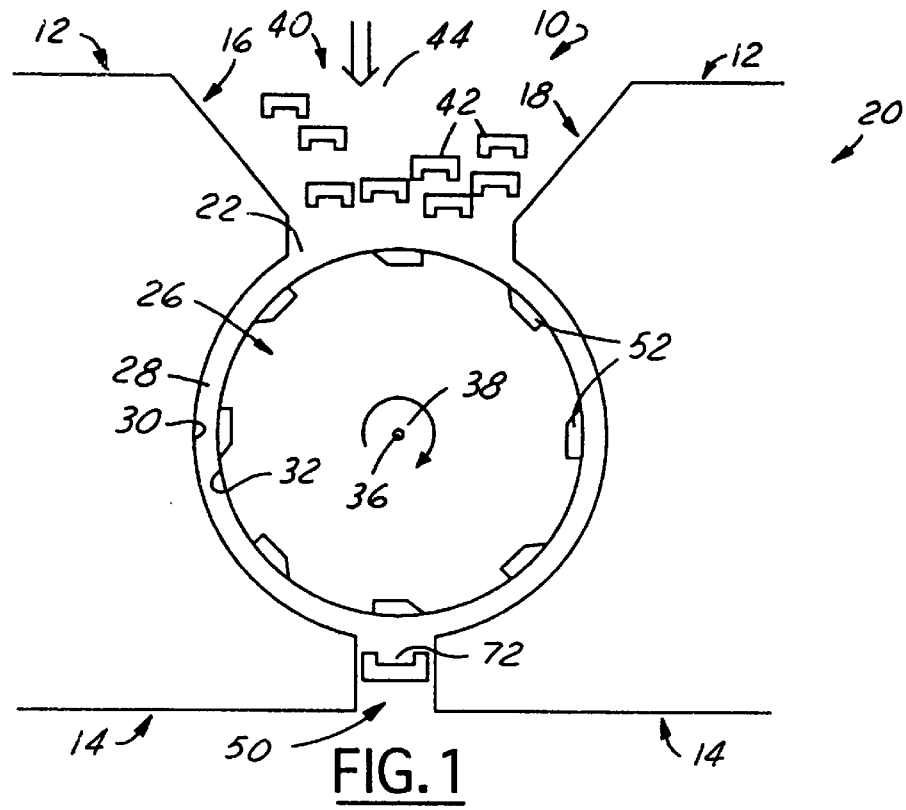
FIG. 1 is a cross-sectional view of the present invention automated carrier tube loading apparatus.

Referring initially to FIG. 1, wherein the present invention apparatus 10 is shown. The automated loading apparatus 10 is constructed by a top surface 12, a bottom surface 14, a front surface 16, a rear surface 18 and an annular cavity 22 formed by the front surface 16 and the rear surface 18 adapted for receiving an annular roller 26 therein while simultaneously, maintaining a gap 28 between an interior wall 30 of the cavity 22 and the exterior peripheral surface 32 of the annular roller 26. The gap 28 is sufficient for allowing a free rotation of the annular roller 26 in the annular cavity 22 through an axis 36. The axis 36 goes through a center aperture 38 in the annular roller 26.

The automated loading apparatus 10 further includes top opening 40 in the top surface 12 of the loader body 20 for communication with the annular roller 26. The top opening 40 has a width that is substantially larger than a width of the carrier tube which the apparatus carries such that a plurality of the carrier tubes 42 may be stowed in the opening 44. A second opening 50 is provided in the bottom surface 14 of the loader body 20 for communication with a tube dispensing device (not shown) that is positioned directly under the tube loader body 20. The second opening 50 has a width that is sufficient to allow only one carrier tube 42 to pass therethrough. The present invention automated loading apparatus 10 further includes an important component of an annular roller 26 that is situated in the annular cavity 22. The annular roller 26 is equipped with a plurality of tube cavities 52 on a peripheral surface 32 while each of the tube cavities 52 is adapted for receiving a carrier tube 42 in a predetermined orientation. The predetermined orientation is controlled by the shape of the tube cavity 52 which is designed for a specific tube carrier 42 such that the carrier tube may only fall into the cavity in a preferred orientation. The carrier tubes 42 are positioned in the cavities 52 by falling into the cavity by gravity while the roller 26 rotates at a predetermined rotational speed in a clockwise direction. Each of the tube cavities 52 therefore receives a carrier tube 42 upon the rotational motion of the roller 26 from the upper cavity 44. Furthermore, as the roller 26 rotates clockwise, one of the tube carriers 42 stored in the tube cavities 52 is rotated to the six o'clock position to fall out of the tube cavity due to gravity into a tube dispensing device (not shown). It should be noted that the opening 50 in the bottom surface 14 of the apparatus 10 is only large enough to allow a single tube carrier 42 to fall through. As the tube carrier 42 falls through the opening 50 from the cavities 52, it falls in a preferred, predetermined orientation such that all the carriers are arranged in an orderly array in the tube dispensing device. The rotational speed of the roller 26 can be suitably controlled to allow the adequate loading of carrier tubes into the cavities, and to allow an adequate dislodging of the tube carriers from the tube cavities in the annular surface of the roller. For instance, a frequently used rotational speed is between about 3 RPM and about 15 RPM, and preferably between about 5 RPM and about 10 RPM.

The tube loader body 20 normally has a length that is similar to the length of the roller 26. It should be noted that the annular roller 26 should be received in the annular cavity 22 in such a way that it is spaced apart from the cavity so that the roller may rotate freely in the cavity to allow each of the plurality of tube cavities in the surface of the roller to receive a carrier tube from the hopper and then dislodging a tube into the bottom opening.

Figure 2A:
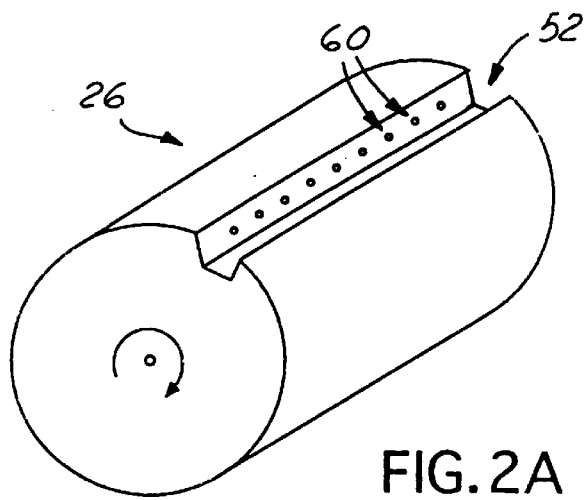
FIG. 2A is a perspective view of the annular roller showing a single carrier tube cavity provided in its surface.
Figure 2B:
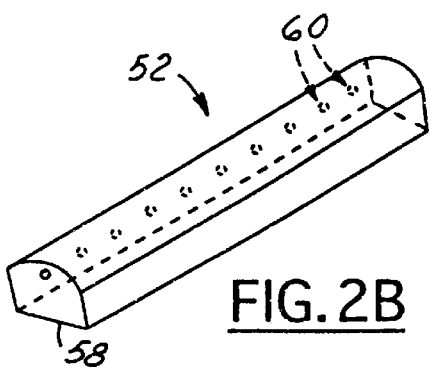
FIG. 2B is a perspective view of the tube cavity shown in FIG. 2A.

Detailed perspective views of the annular roller 26 is shown in FIGS. 2A and 2B. Each of the plurality of tube cavities 52 in the surface 32 of the annular roller 26 is equipped with two sidewalls 54, 56 and a bottom wall 58. One of the sidewalls 54 that is opposite to the direction of rotation is sloped toward an opposite direction of the rotation to facilitate the loading (by a sliding motion) of one of the carrier tubes 42 into the tube cavity 52. The sloped sidewall 54 in the tube cavity 52 is equipped with spring beams 60 to facilitate the ejection of a carrier tube when two carrier tubes are jammed into the cavity 52. The spring means 60 may further facilitate the ejection of a carrier tube 42 when the tube cavity 52 is rotated to a six o'clock position exposing to the bottom opening 50 of the loader body 20 (see FIG. 1).

Figure 2C:
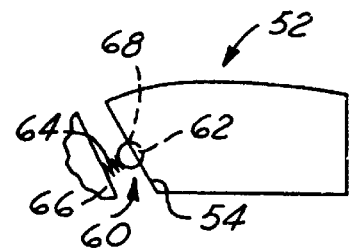
FIG. 2C is a cross-sectional view of the tube cavity having a spring-mounted steel ball in a sloped surface.

A detailed, enlarged view of the spring means 60 is shown in FIG. 2C, the sloped sidewall 54 is provided with openings 68 such that a steel ball 62 may be partially protruded therethrough and pressed by a spring 64 mounted on the opposite support plate 66 to exert upward pressure on the steel ball 62 and thus providing the spring means. The spring means 60 is important in preventing two carrier tubes may be jammed into a single tube cavity 52 and thus causing the jamming of the annular roller 26 and possibly stopping its rotational motion. It should be noted that, while the spring means 60 is illustrated as one means for exerting pressure on a carrier tube stowed therein, any other means may also be used to exert pressure on and thus ejecting two tube carriers stowed in the same cavity.

The top opening 40 in the top surface 12 of the automated loader 10 is normally made sufficiently large such that a multiplicity of carrier tubes 42 may be stowed in the hopper cavity 44, i.e., the cavity 44 is sufficiently large to stow at least 20 or 30 carrier tubes. The number of tube cavities 52 provided in the peripheral surface 32 of the annular roller 26 can be suitably selected depending on the output requirement of the automated loading apparatus. For instance, a suitable number of tube cavities 52 in the annular roller 26 may be between about 4 and about 12.

The tube dispensing device, not shown in the Figures, can be formed by two parallel plates that are positioned side-by-side and thus forming a cavity thereinbetween sufficient for the carrier tubes 42 to fall snugly into the cavity by stacking one on top of the other. The carrier tubes are thus ready for loading of packaged IC chips or for transporting to other process stations for further usage. The annular roller 26 may be suitably mounted on a shaft 36 (or axis) through an aperture 38 that extends in a longitudinal direction in the center of the annular roller 36. Carrier tubes of various dimensions and cross-sections may be suitably handled in the present invention automated loading apparatus. For instance, some of the carrier tubes may have a U-shaped cross-section and thus, the tubes may fall into the tube cavities 52 on the annular roller with the opening 72 pointing toward the center aperture 38 of the roller 26. Other carrier tubes may have a rectangular, a square or any other suitable cross-sections.

The operation of the present invention automated carrier tube loading apparatus can be described as follows. First, a tube loading machine is provided which has a tube loader body 20 and an annular cavity 22 in the body. The tube loader body 20 is equipped with a hopper-shaped top opening 40 which has a size sufficient for receiving a multiplicity of carrier tubes 42. The loader body 20 is further provided with a slot-shaped opening 50 that has a width sufficient to allow only one package tube to pass through at a time. The method can be further carried out by mounting an annular roller 26 in the annular cavity 22 and then allowing the roller 26 to rotate freely in the cavity 22. A plurality of tube cavities 52 that are provided in the peripheral surface 32 of the roller 26 then receives a carrier tube in each of the cavities while the roller 26 is rotated at a predetermined rotational speed in a clockwise direction. When each of the tube cavities 52 is turned to the six o'clock position, a carrier tube 42 is dropped by gravity into a tube dispensing device through the bottom opening 50 in the loader body 20. The method can be suitably carried out with the annular roller 26 rotating at a rotational speed of about 5 RPM. The present invention method may further include the step of providing spring means in a surface of the tube cavity such that the ejection of jammed carrier tubes can be facilitated. The spring means may further facilitate the ejection of a carrier tube into the bottom opening 50 when the tube cavity 52 is exposed to such opening.

The present invention novel method and apparatus has therefore been amply described and demonstrated in the above descriptions and the appended drawings of FIGS. 1~2C. It should be noted that, while the automated loading of an IC carrier tube is illustrated in the preferred embodiment of the present invention, the apparatus and method can be equally applied to any other elongated devices that needs to be loaded into a dispensing device in a predetermined, preferred orientation.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. An apparatus for the automatic loading of IC package tubes into a tube dispensing device in a predetermined orientation comprising:

a loader body having a front surface, a rear surface, a top surface, a bottom surface and an annular cavity formed by said front surface and said rear surface adapted for receiving an annular roller therein and maintaining a gap thereinbetween for allowing rotation of said annular roller in said annular cavity, a first opening in said top surface of the loader body for communication with said annular roller, said opening having a width substantially larger than a width of said IC package tube such that a plurality of said package tubes may be stowed in said opening, a second opening in said bottom surface of the loader body for communication with a tube dispensing device, said second opening having a width sufficient to allow only one package tube to pass therethrough, and an annular roller situated in said annular cavity having a plurality of tube cavities in its annular surface each adapted for receiving a package tube, each of said tube cavities being shaped to receive a package tube having a U-shaped cross-section from said first opening and dispenses said package tube from said second opening into a tube dispensing device in a predetermined orientation with the opening of the U-shape pointing toward a center of said annular roller each time said annular roller completes a rotation in said annular cavity.

2. An apparatus according to claim 1, wherein said loader body having a depth substantially similar to a length of said annular roller.

3. An apparatus according to claim 1, wherein said annular roller is received in and spaced apart from said annular cavity such that said annular roller rotates freely in said annular cavity when each of said plurality of tube cavities carries a package tube.

4. An apparatus according to claim 1, wherein each of said plurality of tube cavities in the surface of said annular roller being equipped with two sidewalls and a bottom wall, one of said sidewalls opposite to the direction of rotation being sloped toward an opposite direction of said rotation to facilitate the sliding of one of said package tubes into said tube cavity.

5. An apparatus according to claim 4, wherein said sloped sidewalls in said plurality of tube cavities being equipped with spring means to facilitate the ejection of a package tube when said tube cavity being rotated to a position juxtaposed to said bottom opening in said loader body.

6. An apparatus according to claim 5, wherein said spring means are steel balls mounted in recesses provided in said sloped sidewalls with springs pushing said steel balls outwardly such that the balls being partially protruded outside the surface in said sloped sidewalls for exerting an outward pressure on said package tubes.

7. An apparatus according to claim 1, wherein said first opening being sufficiently large for accepting a multiplicity of package tubes.

8. An apparatus according to claim 7, wherein said multiplicity of package tubes being at least ten tubes.

9. An apparatus according to claim 1, wherein said plurality of tube cavities in said annular roller comprises at least 8 cavities.

10. An apparatus according to claim 1, wherein said tube dispensing device is formed by two parallel plates positioned side-by-side having a cavity thereinbetween sufficient for said package tubes to fit snugly in said cavity by stacking one on top of the other.

11. An apparatus according to claim 1, wherein said annular roller is mounted on a shaft through an aperture extending along a longitudinal direction at the center of said roller.

12. An apparatus for the automatic loading of IC package tubes into a tube dispensing device in a predetermined orientation comprising:

a loader body having a front surface, a rear surface, a top surface, a bottom surface and an annular cavity formed by said front surface and said rear surface adapted for receiving an annular roller therein and maintaining a gap thereinbetween for allowing rotation of said annular roller in said annular cavity, a first opening in said top surface of the loader body for communication with said annular roller, said opening having a width substantially larger than a width of said package tube such that a plurality of said package tubes may be stowed in said opening, a second opening in said bottom surface of the loader body for communication with a tube dispensing device, said second opening having a width sufficient to allow only one package tube to pass therethrough, an annular roller situated in said annular cavity having a plurality of tube cavities in its annular surface each adapted for receiving a package tube such that when said roller rotates in said annular cavity, each of said tube cavities receives a package tube from said first opening and dispenses said package tube from said second opening into a tube dispensing device in a predetermined orientation, each of said plurality of tube cavities in the surface of said annular roller being equipped with two sidewalls and a bottom wall, one of said sidewalls opposite to the direction of rotation being sloped toward an opposite direction of said rotation to facilitate the sliding of one of said package tubes into said tube cavity, and said sloped sidewalls in said plurality of tube cavities being equipped with spring means to facilitate the ejection of a package tube when said tube cavity being rotated to a position juxtaposed to said bottom opening in said loader body.

13. An apparatus according to claim 12, wherein said annular roller is received in and spaced apart from said annular cavity such that said annular roller rotates freely in said annular cavity when each of said plurality of tube cavities carries a package tube.

14. An apparatus according to claim 12, wherein said spring means are steel balls mounted in recesses provided in said sloped sidewalls with springs pushing said steel balls outwardly such that the balls being partially protruded outside the surface in said sloped sidewalls for exerting an outward pressure on said package tubes.

15. An apparatus according to claim 12, wherein said plurality of tube cavities in said annular roller comprises at least 8 cavities.

16. An apparatus according to claim 12, wherein said tube dispensing device is formed by two parallel plates positioned side-by-side having a cavity thereinbetween sufficient for said package tubes to fit snugly in said cavity by stacking one on top of the other.

17. An apparatus according to claim 12, wherein said annular roller is mounted on a shaft through an aperture extending along a longitudinal direction at the center of said roller.

18. A method for conveying package tubes into a tube dispensing device in a preset orientation comprising the steps of:

providing a tube loading machine having a tube loader body and an annular cavity in said body, said tube loader body having a hopper-shaped top opening of a size sufficient for receiving a multiplicity of package tubes and a slot-shaped bottom opening having a width sufficient to allow package tubes to pass therethrough one at a time, mounting an annular roller in said annular cavity and allowing said roller to rotate freely in said cavity, said annular roller having a plurality of tube cavities provided on its surface each adapted for receiving a package tube therein, providing spring means in a surface of the tube cavity to facilitate the ejection of the package tube into the tube dispensing device, loading a package tube in each of said tube cavities on said annular roller by rotating said roller body, and depositing a package tube into said tube dispensing device through said slot-shaped bottom opening in said tube loader body where said tube cavity is turned to a position exposed to said opening.

19. A method according to claim 18 further comprising the step of rotating said annular roller body at a rotational speed of at least 5 RPM.

20. A method according to claim 18, wherein said annular roller body is mounted in said annular cavity by a shaft extending through an aperture in said annular roller body.

* * * * *